United States Patent [19]

Engel et al.

[11] Patent Number: 5,600,527

[45] Date of Patent: Feb. 4, 1997

[54] CIRCUIT INTERRUPTER PROVIDING PROTECTION AND WAVEFORM CAPTURE FOR HARMONIC ANALYSIS

[75] Inventors: Joseph C. Engel, Monroeville; Gary F. Saletta, Irwin; Richard A. Johnson, Hopewell Township, all of Pa.

[73] Assignee: Eaton Corporation, Cleveland, Ohio

[21] Appl. No.: 363,193

[22] Filed: Dec. 22, 1994

[51] Int. Cl.$^6$ ..................................................... H02H 3/00
[52] U.S. Cl. .............................. 361/93; 341/123; 364/487
[58] Field of Search ...................... 364/480–493; 324/119–120, 76.58, 500, 509, 512, 535; 341/122–123; 361/93–97, 88–89, 62–63, 65, 67, 78–80

[56] References Cited

U.S. PATENT DOCUMENTS

| | | | |
|---|---|---|---|
| 4,291,299 | 9/1981 | Hinz et al. | 340/347 AD |
| 4,672,555 | 6/1987 | Hart et al. | 364/483 |
| 4,709,339 | 11/1987 | Fernandes | 364/492 |
| 5,060,166 | 10/1991 | Engel | 364/487 |
| 5,224,054 | 6/1993 | Wallis | 364/483 |
| 5,233,538 | 8/1993 | Wallis . | |

*Primary Examiner*—Brian K. Young
*Assistant Examiner*—Michael J. Sherry
*Attorney, Agent, or Firm*—Martin J. Moran

[57] ABSTRACT

A circuit breaker with a digital trip unit has a protection mode and a waveform capture mode of operation. In the protection mode, an equivalent sampling technique based upon pairs of samples spaced 90 electrical degrees apart with a pattern of delays between pairs is used to digitize the waveforms in the protected electrical system. Synchronous sampling is used in the waveform capture mode. The value of each sample is monitored in the waveform capture mode and a transfer is made back to the protection mode if a threshold value indicating an overcurrent condition is exceeded. The percentage total harmonic distortion, and per harmonic distortion for harmonics, up to and including the 27th are sequentially presented on a display on the front panel of the circuit breaker and can be transmitted along with the raw waveform data to a remote processor.

11 Claims, 5 Drawing Sheets

CIRCUIT INTERRUPTER PROVIDING PROTECTION AND WAVEFORM CAPTURE FOR HARMONIC ANALYSIS

CROSS-REFERENCE TO RELATED APPLICATION

Our application Ser. No. 08/342,208, filed Nov. 18, 1994, entitled: "APPARATUS PROVIDING PROTECTION AND METERING IN AN AC ELECTRICAL SYSTEM UTILIZING A MULTI-FUNCTION SAMPLING TECHNIQUE".

BACKGROUND OF THE INVENTION

1. Field of the Invention

This invention relates to a circuit interrupters which provide waveform capture for harmonic analysis of the waveforms in a protected electrical system, as well as overcurrent protection.

2. Background Information

State of the art circuit interrupters, which includes, for instance, circuit breakers, vacuum interrupters, contactors, motor controllers and the like, have a trip unit incorporating a microprocessor. The microprocessor executes algorithms which implement a protection curve. Typically in circuit breakers and vacuum interrupters, the protection curve provides an instantaneous trip, a long delay trip, and if appropriate, a short delay trip function. The microprocessor supervises analog to digital conversion of the analog waveforms as well as executing the protection algorithms. In some circuit interrupters, the microprocessor also performs calculations for metering. All of these functions place a burden on the microprocessor. Thus, the sampling rate must be balanced against the processing time required for the other functions performed by the microprocessor.

While the instantaneous and short delay protection functions respond to the essentially sinusoidal fault currents which occur in an electrical distribution system, the long delay and metering functions are more sensitive to distortions in the waveforms of the electrical system which are becoming more common. Distorted waveforms require more samples per cycle to accurately represent the waveform; however, higher sampling rates reduce the time available for the microprocessor to perform its other assigned functions. One approach to solving this dilemma has been the development of equivalent sampling techniques. In equivalent sampling, the timing between several repetitions of a pattern of samples taken over several cycles is "bumped", so that when all of the samples are superimposed on an equivalent single cycle by waiting until the several repetitions of the pattern have been completed, a higher effective sampling rate is achieved. Our cross-referenced application discloses an equivalent sampling technique in which the timing between successive pairs of samples taken 90 electrical degrees apart is adjusted to produce an equivalent sampling rate of 64 samples per cycle. Each pair of samples provides a measurement of the rms value of the fundamental frequency of the waveform.

There is also a growing interest in the capability of determining the amount of distortion in the waveforms. Monitors have been developed to analyze, and in particular to determine the harmonic content of waveforms in an electrical distribution system. However, according to the Nyquist criteria, a waveform must be sampled at greater than twice the frequency of the highest harmonic to be extracted. This requires very high sampling rates in order to capture the harmonics that are typically of interest. For example, if up to the 50th harmonic is to be extracted, sampling must be performed at the rate in excess of 6 KHz. Furthermore, the Fourier analysis typically used to extract the harmonics requires considerable processing time. The result is that dedicated units have been developed for waveform analysis. These units may do some metering in addition to the waveform analysis, but they do not perform protection functions. The high sampling rate required for the waveform analysis is compatible with providing protection; however, it requires so much computer time that none is left to provide protection. Some of the monitoring units capture the waveform digitally for later analysis, either in the unit or in a remote processor connected to the unit by a communications link. Commonly owned U.S. patent application Ser. No. 08/325,711 filed on Oct. 17, 1994. in the name of Robert Elms discloses an analyzer which uses an equivalent sampling rate for metering and a synchronous rate for waveform capture. This analyzer also calculates harmonic distortion, but it does not provide protection.

There is a need, therefore, for an improved circuit interrupter which can provide waveform capture as well as protection functions.

There is also a need for such an improved circuit interrupter which can perform the harmonic analysis on the captured waveform internally, and which can preferably display the results of the harmonic analysis.

There is an additional need for such an improved circuit interrupter which can perform all of these functions at a competitive cost.

SUMMARY OF THE INVENTION

These needs and others are satisfied by the invention which is directed to a circuit interrupter which provides waveform capture in addition to protection functions. The circuit interrupter includes processing means which operates in a protection mode to provide the protection functions and in a waveform capture mode to record the waveform data. While operating in the waveform capture mode, the processing means continually monitors the current and transfers to the protection mode if certain conditions exist, such as in the exemplary embodiment of the invention, when a current threshold is exceeded.

As another aspect of the invention, sampling is performed at a first sampling rate when operating in the protection mode, and at a second rate when operating in the waveform capture mode. Sampling in the waveform capture mode is performed synchronously, while an equivalent sampling rate can be used in the protection mode. Preferably, the protection mode generates pairs of samples 90 electrical degrees apart with the delay between pairs adjusted to produce a selected equivalent sampling rate.

As an additional aspect of the invention, the waveform data generated during the waveform capture mode is used to perform harmonic analysis on the waveforms including individual harmonic content. The harmonic content is presented on a display, preferably numerically with digits representing the harmonic followed by digits representing the percentage individual harmonic content as compared to the magnitude of the fundamental frequency.

More particularly the invention is directed to:
a circuit interrupter for interrupting current in an electrical system, said circuit interrupter comprising:
separable contacts interrupting current in said electrical system when opened;

means generating digital samples of waveforms in said electrical system including said current; and processing means tripping said separable contacts open in response to a selected current/time characteristic of said current determined from said digital samples, and generating an output representing harmonic content of said waveforms from said digital samples.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENT

Figure 1:
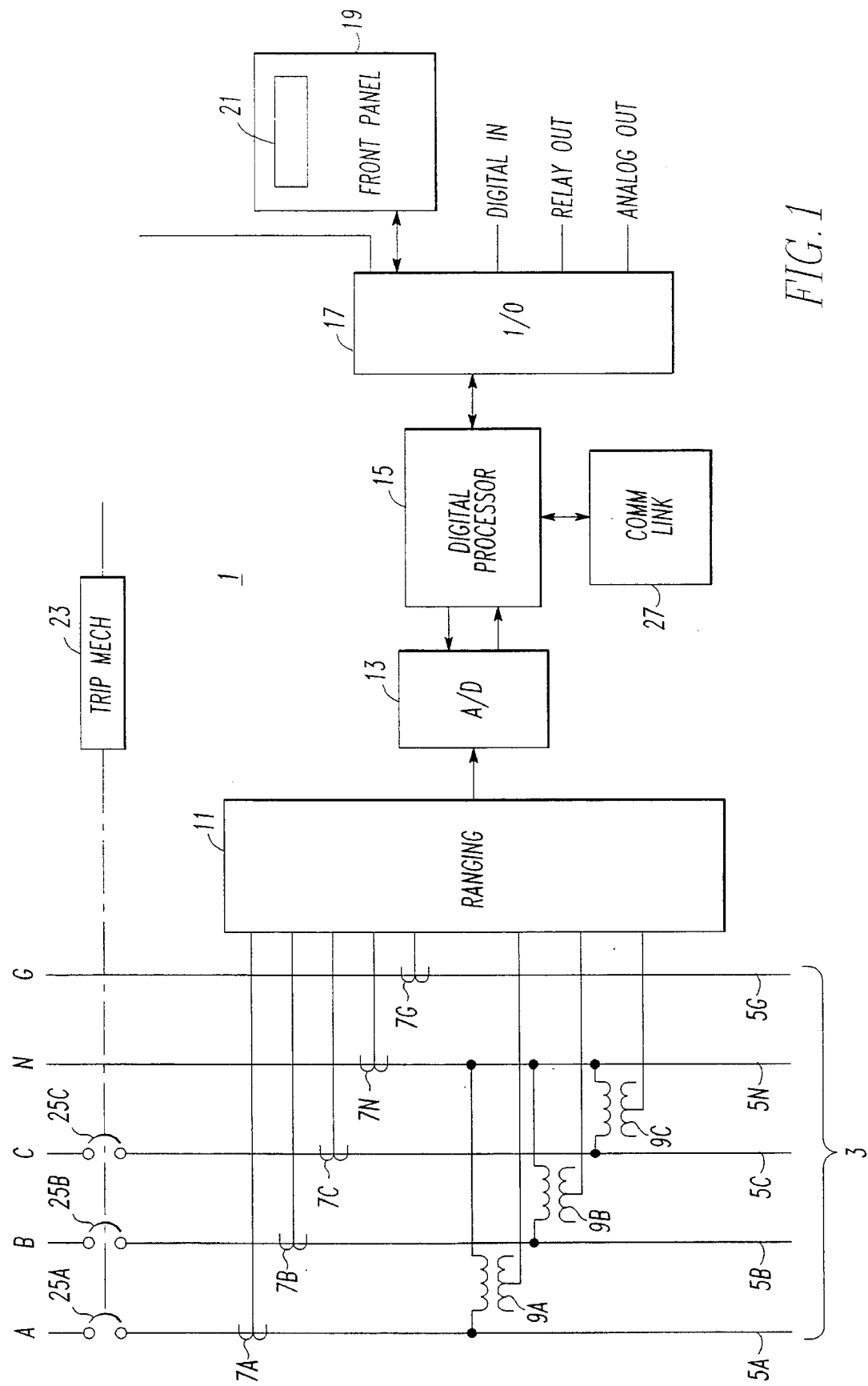
FIG. 1 is a schematic diagram primarily in block form illustrating a circuit interrupter in accordance with the invention.

FIG. 1 illustrates a circuit breaker 1 of the invention used for protection and capture of the waveforms in an ac electrical power system 3. The power distribution system 3 illustrated has three phase conductors, 5A, B and C, a neutral conductor 5N and a ground conductor 5G. Current transformers 7A, B, C, N and G sense current flowing in each of these conductors while phase to neutral voltages are sensed by the potential transformers 9A, B and C. A ranging circuit 11 converts the current and voltage signals to a suitable range for conversion by analog to digital (A/D) converter 13 for input to a digital processor 15. The A/D converter 13 samples analog voltages and currents at sampling instants determined by interrupts generated by the digital processor 15 in a manner to be described. The digital processor 15 utilizes the data generated by the digital samples to provide protection functions and in particular instantaneous, short-delay and long-delay protection for the electrical system 3, and also uses the samples for waveform capture and harmonic analysis.

The digital processor 15 has an input/output (I/O) 17 through which the digital processor 15 communicates with a front panel 19. The front panel 19 serves as the interface with the user. It is through the front panel 19 that the user can control the operation of the circuit breaker 1, and monitor the ac electrical power systems 3, including the harmonic content of the waveforms. To this end, the front panel 19 has a display 21 on which the harmonic content of the waveforms can be presented to the user in a manner to be described. The display 21 can also be used to present metered parameters and the circuit breaker protection set points.

In implementing the protection functions, the digital processor 15 operates in a protection mode to generate a trip signal when any one of the current/time characteristics of a protection function is exceeded. This trip signal is passed by the I/O 17 to a trip mechanism 23 which opens separable contacts 25A, B and C in the phase conductors 5A, B and C of the electrical system 3. Although typically not provided in the United States, additional separable contacts can be included to also interrupt current in the neutral conductor 5N and the ground conductor 5G.

The input/output device 17 also interfaces the digital processor 15 with contact inputs through a digital input. Relay outputs and analog outputs are also provided through the input/output device 17. The digital processor 15 can also communicate with a remote processor using a communications link 27 through which the circuit breaker 1 can provide information to and/or be controlled by a remote processor (not shown).

The digital processor 15 controls sampling of the various current and voltage waveforms by the A/D converter 13 by generating interrupts which establish the sampling instants. Our related application, which is hereby incorporated by reference, explains in detail the sampling technique used for the protection and metering functions. As mentioned there, the different protection functions and the metering functions have different sampling requirements. As discussed above, waveform capture, especially for harmonic analysis, has even more diverse sampling requirements.

Instantaneous protection which trips the circuit breaker open in response to short circuits requires rapid response, while long-delay protection and metering do not require rapid response. Also, the short circuit currents to which the instantaneous trip responds are typically sinusoidal, while the long-delay function and metering need to take into account distortions in the waveform from a pure sinusoid. The rapid response to pure sinusoidal current required for instantaneous protection can be provided by pairs of samples of the fundamental frequency of the waveform taken 90 electrical degrees apart.

As set forth in our copending application, the peak value of the fundamental frequency of the ac waveform can be calculated from two samples taken 90° apart at any point in the waveform. More particularly, the RMS value of the current is calculated by taking the square root of ½ of the sum of the values of the pair samples squared. Thus, the squared values of the samples are proportional to the RMS value of the sinusoidal waveform, and for protection purposes, it is not necessary to calculate the square root, which requires appreciable processor time. Instead, the sum of the squares of the samples in the pair can be compared to a threshold representative of the instantaneous pick-up current.

While a single pair of samples can be used for instantaneous protection, in the preferred implementation of the sampling technique, a running sum is maintained of the sum of the squares of the two most recent pairs of samples. This reduces the risk of false trips based upon spikes in the waveform yet still provides very rapid response. Furthermore, the calculations required by the digital processor 15 are still minimal so that the processor has additional time to perform other functions. Also, by maintaining a running sum of the squares of the most recent two pairs of samples, an instantaneous trip can be generated by the first pair of samples taken after a fault if the fault current is large enough that the sum of four samples exceeds the instantaneous pickup threshold. This could also occur, for instance, where the fault occurs between the samples in a pair so that the values of the subsequent three samples, the second sample of the pair during which the fault occurs and the next successive pair, cause the sum of four samples to exceed the threshold value.

Two pairs of samples are also used in providing short delay protection. As typical short delay protection requires that the current remain above a threshold level, which is somewhat lower than the threshold for instantaneous protection, for a time period of about 0.1 to 0.5 seconds, for example, it is not necessary to calculate the current as rapidly as for instantaneous protection. Therefore, in the preferred implementation, the sum of the squares, $S_4$, for the two most recent pairs of samples is only monitored for short delay protection on every other pair of samples, rather than on every pair of samples as for instantaneous protection. This leaves additional time for the processor to perform its other functions.

An important aspect of the technique is that a time delay is interposed between successive pairs of samples. This time delay is not a multiple of 90° so that successive pairs of samples are sampling different parts of the fundamental waveform. In fact, the delay between successive pairs of samples is not fixed but is adjusted to produce a desired equivalent sampling rate after a given number of samples. Equivalent sampling distributes a given number of samples taken over multiple cycles at angular instants in the waveform so that when superimposed on a single equivalent cycle, the samples are distributed, preferably evenly. The effect of concentrating all the samples in a single cycle is realized by repetitively waiting to use the samples until the given number has been gathered. Typically in equivalent sampling, a selected number of samples is taken per cycle with a consistent delay or "bump" between repetitions. In accordance with the present technique, the delay between successive pairs of samples is not constant, but does follow a repetitive pattern. In the exemplary technique, the spacing between successive pairs of samples is adjusted so that an equivalent sampling rate of 64 equally spaced samples per cycle is produced. The exemplary technique also produces an equivalent sampling rate of 16 equally spaced samples per cycle. Four patterns of sixteen samples per cycle are sequentially generated with phase shifts with respect to one another to produce the equivalent sampling rate of sixty-four evenly spaced samples per cycle.

As an alternative to using the equivalent sampling rate of 64 samples per cycle for both long delay protection and metering, the long delay calculations could be made using the 16 sample per cycle equivalent sampling rate. The higher, 64 samples per cycle, equivalent sampling rate is preferred because time is not critical in long delay protection and the 64 sample per cycle equivalent sampling rate takes into account more harmonics.

Table 1 illustrates the sampling technique as applied to a 60 Hz waveform. As can be seen from the table, each pair of samples, i.e., 0–1, 2–3, etc. are 90° or 4.166667 ms apart for 60 Hz. Each delay between pairs of samples assumes one of four values which are repeated in a sequence which produces an equivalent sampling rate of sixteen samples per cycle after sixteen samples and sixty-four evenly spaced samples per cycle after sixty-four samples. In Table 1, the sample count indicates the number of the sample. The "sixty-four equiv" value represents the position of the respective samples in the equivalent sampling cycle. For instance, sample "1" ends up in position 16 in the equivalent sampling cycle for the 64 sample per cycle equivalent sampling rate. The "bump" column represents the time delay between samples. It will be noted after every other sample the "bump" time, which is implemented after the sample, is 4.16667 ms which is the 90° between paired samples at 60 Hz. The "time" column indicates the time after the initial sample that the particular sample is taken. It can be seen that the total time for taking sixty-four samples of a 60 Hz waveform is 319.0104 ms or a little over nineteen cycles.

TABLE 1

| sample | time | bump | 64*eqiv | sin |
|---|---|---|---|---|
| 0 | 0 | 4.166667 | 0 | 0 |
| 1 | 4.166667 | 6.25 | 16 | 1 |
| 2 | 10.41667 | 4.166667 | 40 | −0.70711 |
| 3 | 14.58333 | 5.208333 | 56 | −0.70711 |
| 4 | 19.79167 | 4.166667 | 12 | 0.92388 |
| 5 | 23.95833 | 6.25 | 28 | 0.382683 |
| 6 | 30.20833 | 4.166667 | 52 | −0.92388 |
| 7 | 34.375 | 7.291667 | 4 | 0.382683 |
| 8 | 41.66667 | 4.166667 | 32 | 2.79E-15 |
| 9 | 45.83333 | 6.25 | 48 | −1 |
| 10 | 52.08333 | 4.166667 | 8 | 0.707107 |
| 11 | 56.25 | 5.208333 | 24 | 0.707107 |
| 12 | 61.45833 | 4.166667 | 44 | −0.92388 |
| 13 | 65.625 | 6.25 | 60 | −0.38268 |
| 14 | 71.875 | 4.166667 | 20 | 0.92388 |
| 15 | 76.04167 | 4.947917 | 36 | −0.38268 |
| 16 | 80.98958 | 4.166667 | 55 | −0.77301 |
| 17 | 85.15625 | 6.25 | 7 | 0.634393 |
| 18 | 91.40625 | 4.166667 | 31 | 0.098017 |
| 19 | 95.57292 | 5.208333 | 47 | −0.99518 |
| 20 | 100.7813 | 4.166667 | 3 | 0.290285 |
| 21 | 104.9479 | 6.25 | 19 | 0.95694 |
| 22 | 111.1979 | 4.166667 | 43 | −0.88192 |
| 23 | 115.3646 | 7.291667 | 59 | −0.4714 |
| 24 | 112.6563 | 4.166667 | 23 | 0.77301 |
| 25 | 126.8229 | 6.25 | 39 | −0.63439 |
| 26 | 133.0729 | 4.16667 | 63 | −0.09802 |
| 27 | 137.2396 | 5.208333 | 15 | 0.995185 |
| 28 | 142.4479 | 4.166667 | 35 | −0.29028 |
| 29 | 146.6146 | 6.25 | 51 | −0.95694 |
| 30 | 152.8646 | 4.166667 | 11 | 0.881921 |
| 31 | 157.0313 | 4.947917 | 27 | 0.471397 |
| 32 | 161.9792 | 4.166667 | 46 | −0.98079 |
| 33 | 166.1458 | 6.25 | 62 | −0.19509 |
| 34 | 172.3958 | 4.166667 | 22 | 0.83147 |
| 35 | 176.5625 | 5.208333 | 38 | −0.55557 |
| 36 | 181.7708 | 4.166667 | 58 | −0.55557 |
| 37 | 185.9375 | 6.25 | 10 | 0.83147 |
| 38 | 192.1875 | 4.166667 | 34 | −0.19509 |
| 39 | 196.3542 | 7.291667 | 50 | −0.98079 |
| 40 | 203.6458 | 4.166667 | 14 | 0.980785 |
| 41 | 207.8125 | 6.25 | 30 | 0.19509 |
| 42 | 214.0625 | 4.166667 | 54 | −0.83147 |
| 43 | 218.2292 | 5.208333 | 6 | 0.55557 |
| 44 | 223.4375 | 4.166667 | 26 | 0.55557 |
| 45 | 227.6042 | 6.25 | 42 | −0.83147 |
| 46 | 233.8542 | 4.166667 | 2 | 0.19509 |
| 47 | 238.0208 | 4.947917 | 18 | 0.980785 |
| 48 | 242.9688 | 4.166667 | 37 | −0.4714 |
| 49 | 247.1354 | 6.25 | 53 | −0.88192 |
| 50 | 253.3854 | 4.166667 | 13 | 0.95694 |
| 51 | 257.5521 | 5.208333 | 29 | 0.290285 |
| 52 | 262.7604 | 4.166667 | 49 | −0.99518 |
| 53 | 266.9271 | 6.25 | 1 | 0.098017 |
| 54 | 273.1771 | 4.166667 | 25 | 0.634393 |
| 55 | 277.3438 | 7.291667 | 41 | −0.77301 |
| 56 | 284.6354 | 4.166667 | 5 | 0.471397 |
| 57 | 288.8021 | 6.25 | 21 | 0.881921 |
| 58 | 295.0521 | 4.166667 | 45 | −0.95694 |
| 59 | 299.2188 | 5.208333 | 61 | −0.29028 |
| 60 | 304.4271 | 4.166667 | 17 | 0.995185 |
| 61 | 308.5938 | 6.25 | 33 | −0.09802 |
| 62 | 314.8438 | 4.166667 | 57 | −0.63439 |
| 63 | 319.0104 | 4.947917 | 9 | 0.77301 |

This equivalent sampling rate of sixty-four samples per cycle is used in the exemplary apparatus for long delay protection and for metering as it provides the capability of responding to distorted waveforms. From the "time" column of Table 1, it can be seen that this high equivalent sampling rate is achieved without placing undo burden on the processor in generating the samples as the shortest interval between individual samples is the 4.16667 ms between samples in each pair.

The sixty-four and sixteen sample per cycle equivalent sampling rates have been illustrated for a 60 Hz fundamental waveform. The distribution of the samples is also provided in terms of electrical degrees as illustrated in the "sin" column of Table 1. This angular distribution can be used to develop the timing for sampling for any other frequency, such as for instance, 50 Hz.

As mentioned, the sampling requirements for waveform capture differ from those for protection, and to a lesser extent from those for metering. In order to perform a Fourier analysis to determine harmonic content, an integer number of evenly spaced samples are taken per cycle. It is not required that sampling commence at any particular point in the waveform, such as a zero crossing.

Thus, in accordance with the invention when a command for waveform capture is initiated either through the front panel 19, or from a remote location through the communications link 27, the processor 15 transfers to a capture mode wherein the waveforms are synchronously sampled with the samples being stored for harmonic analysis, and if desired, for generating a waveform display for the later purpose, the waveform sample data can be sent to a remote processor (not shown) through the communications link 27.

In the exemplary embodiment of the invention, samples from one cycle of each of the current waveforms are captured at a synchronous sampling rate of 58 samples per cycle and stored. Actually, 64 samples are taken in slightly more than one cycle, but only the 58 samples representing one cycle are used in the harmonics calculations.

An important aspect of the invention is that protection is not ignored when the processor is operating in the capture mode. The value of each sample taken in the capture mode is compared to a threshold value. If value of any of the samples exceeds the threshold value, the processor transfers to the protection mode. The threshold value is a function of the pick-up value of the long delay trip. As the pick-up values used in the protection mode are RMS values, the threshold is $\sqrt{2}$ X the selected pick-up value.

Figure 2A:
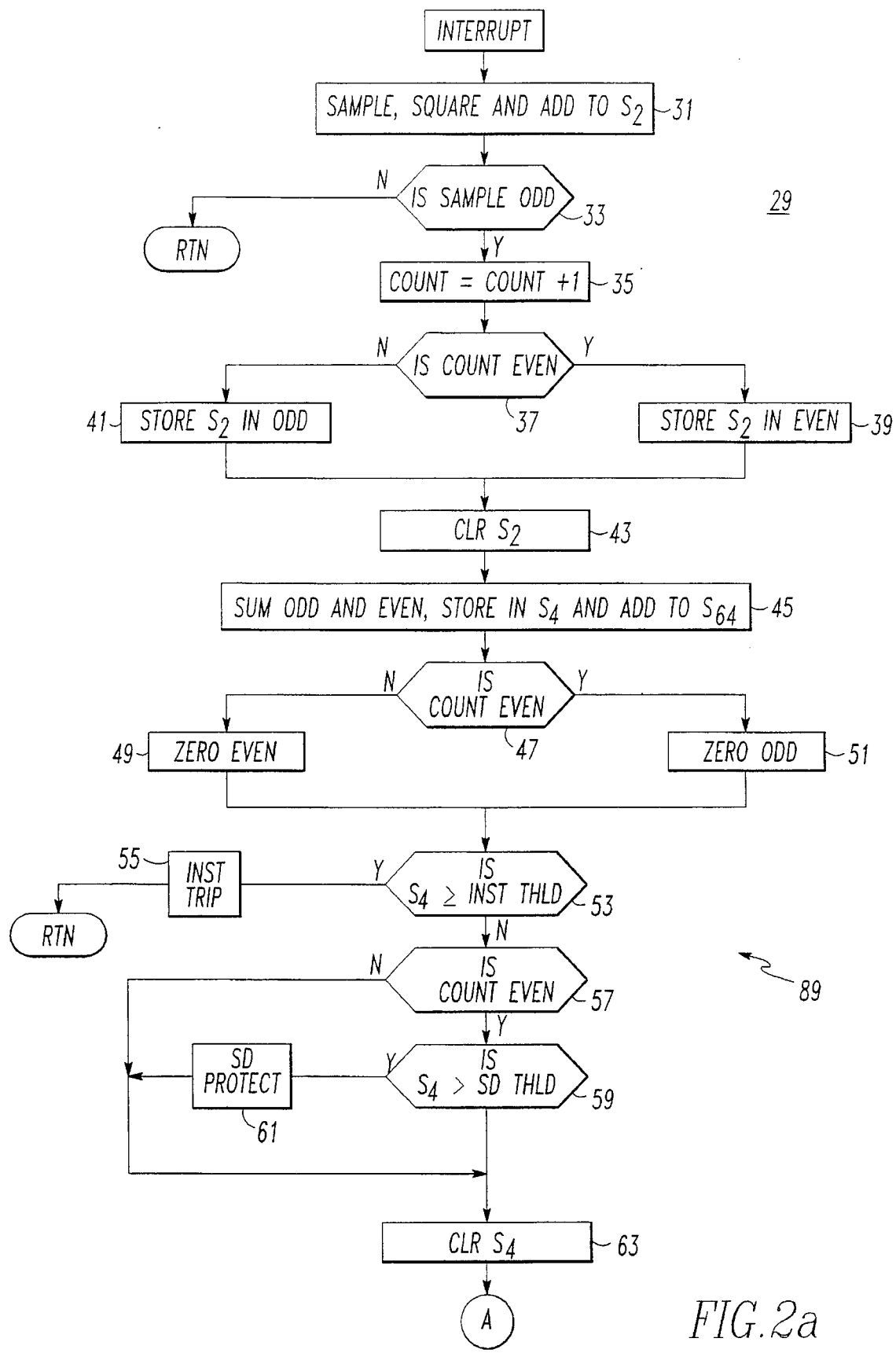
FIG. 2A and 2B illustrate a flow chart for an interrupt routine used by the digital processor of the circuit interrupter of the invention.

FIGS. 2A and B illustrate an interrupt routine 29 utilized by the digital processor 15 to provide protection and metering utilizing the sampling technique just described. Each time the routine 29 is called, the waveforms are sampled, squared and added to a sum of squares for a pair, $S_2$, at 31. If the sample is not odd at 33 indicating that it is the first sample of a pair, then the routine returns to the main program. On the second sample of a pair (an odd sample), a COUNT is incremented at 35. If the COUNT is even at 37, then the sum of the squares, $S_2$, for the pair is stored in a register called EVEN at 39. On alternate COUNTS, $S_2$ is stored in a register named ODD at 41. The sum of the squares for the pair is then cleared at 43. The contents of the ODD and EVEN registers are then summed at 45 to produce the sum of the squares for the last four samples. This value is stored in $S_4$ and is added to a quantity $S_{64}$ which is an accumulated sum of the sixty-four samples taken at the equivalent sampling rate of sixty-four samples per cycle.

If COUNT is odd at 47, then the EVEN register is zeroed at 49. On EVEN counts, the ODD register is zeroed at 51. If the sum of squares for the most recent two pairs of samples, $S_4$, exceeds a threshold representative of an instantaneous pick-up current at 53, an instantaneous trip routine is called at 55. On alternate counts, i.e., every other sample pair, as determined at 57, the sum of the squares for the two most recent pairs of samples is compared to a threshold representative of the short delay pick-up current at 59. If the short delay pick-up current is exceeded, a short delay protection routine is called at 61. This routine times the interval that the current remains above the short delay pick-up value and generates a trip when this interval exceeds the short delay interval.

After checking instantaneous and short delay protection, the register $S_4$ is cleared at 63. When 64 samples have been taken, as determined at 65 (COUNT records the number of pairs of samples), the accumulated sum of the squares for the sixty-four samples, $S_{64}$, is compared at 67 with a threshold representative of the long delay pick-up value. If this long delay pick-up value is exceeded, a long delay protection subroutine 69 is called. This subroutine generates a trip signal when the long delay time out value has been exceeded.

If the accumulated sum of the squares of 64 samples, $S_{64}$, does not exceed the long delay threshold at 67, a check is made at 71 as to whether a request had been made for waveform capture. Such a request can be made locally by a user input through the front panel 19 or can be received through the communications link 27 from a remote site such central computer (not shown).

If a request has been made for waveform capture, the system transfers out of the protection mode into the waveform capture mode. Upon entering the waveform capture mode, a sample count, N, is zeroed at 73 and then the currents (phase, neutral, and ground) are sampled at 75 (voltages can also be sampled if desired). As mentioned above, the circuit interrupter does not ignore protection when in the waveform capture mode. Thus, the instantaneous values of the phase current samples are compared to a limit at 77. If this limit is exceeded, the system transfers back to the protection mode. The instantaneous value of each ground current sample is similarly compared at 79 to a ground current limit, and a transfer is made to the protection mode if this limit is exceeded by any of ground current samples.

If the instantaneous values of the current samples are below the transfer limits, they are all stored at 81, and the count N is incremented at 83. This process is repeated until 64 samples have been captured as determined at 85. The samples are taken synchronously in this waveform capture mode of operation 87 represented by the blocks 73 to 85. That is, an integer number of equally spaced samples are taken per cycle. The phase of this integer number of samples can be random with respect to the phase of the currents. While 64 samples of each current are taken and stored in the exemplary circuit breaker during waveform capture, the integer number of samples taken in a cycle is actually 58. This sampling rate is a function of the time available for sampling in the microprocessor 15. When waveform capture is completed, the system reverts to the protection mode 89 represented by the blocks in FIG. 2A and B other than the blocks 73–83, and resumes the equivalent sampling scheme more fully described in connection with FIG. 3 below.

Following long delay protection or waveform capture, metering is performed at 91. This metering can include generation of RMS values for the currents and voltages, and other metering functions such as calculation of power and energy, as desired. The register $S_{64}$ is then cleared at 93 and the COUNT is reset to zero at 95 before the program is exited.

Figure 3:
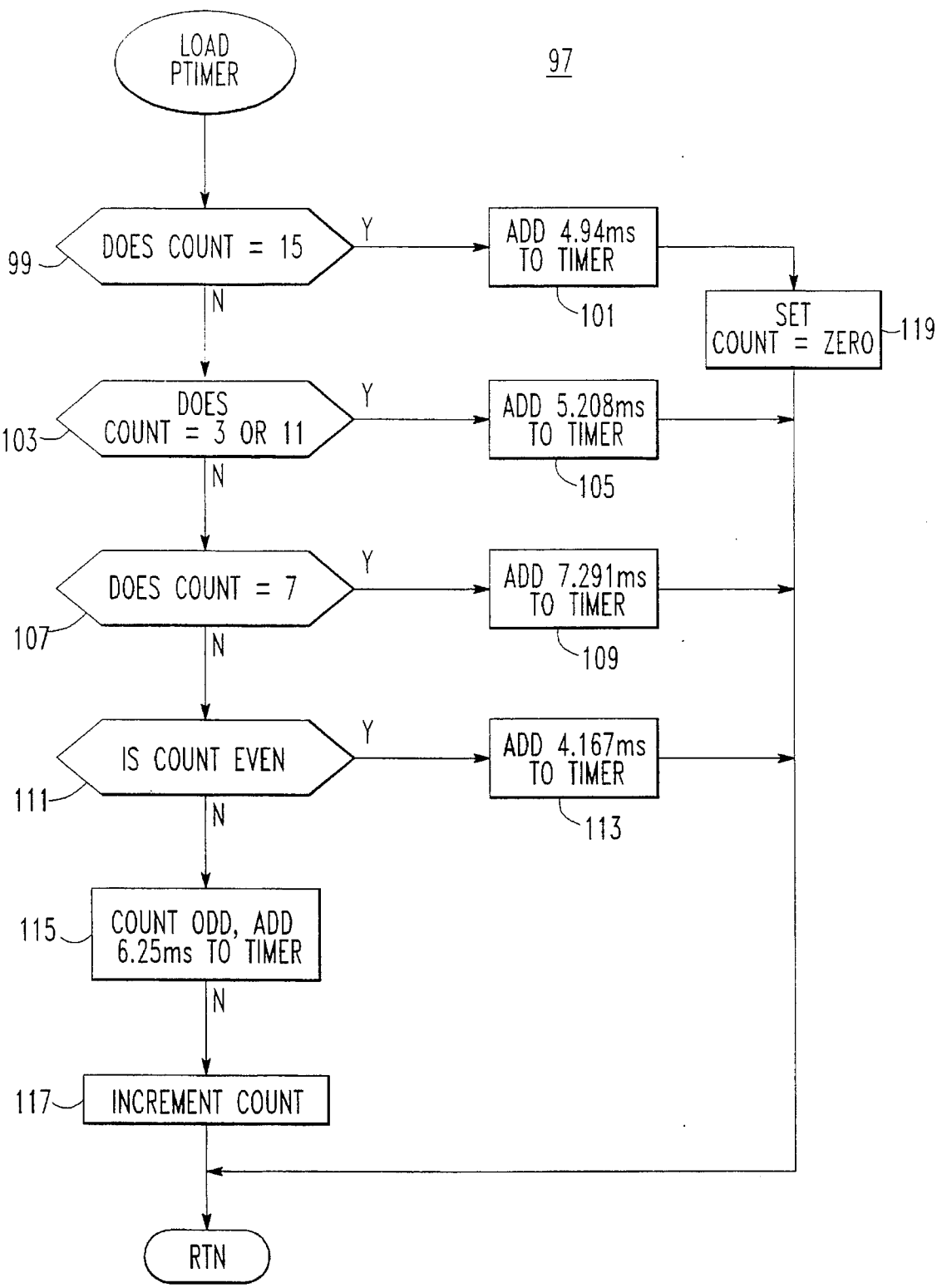
FIG. 3 is a flow chart of an equivalent sampling routine used by digital processor of the circuit interrupter of the invention.

FIG. 3 illustrates a flow chart of a routine 95 used by the digital processor 15 to generate pairs of samples 90° apart and to adjust the time intervals between pairs of samples in accordance with the equivalent sampling technique described above. This is accomplished by loading an interrupt timer. The times illustrated in the exemplary flow chart are for a 60 Hz waveform. A count of the samples is maintained. When the sample just taken is number 15 as determined at 99, 4.94 ms is added to the timer at 101. If the count is 3 or 11 as determined at 103, 5.208 ms are added to the timer at 105, and if the count is equal to 7 at 107, 7.291 ms are added to the timer at 109. If the count is even at 111, then 4.167 ms are added to the timer at 93. If the count is not even at 101, then 6.25 ms is added to the timer at 115. The first time the routine is called, the count is 0. Since this is an EVEN count as determined at 111, the 4.167 ms equivalent to 90 electrical degrees is added to the timer at 113 so that the next sample will be taken 90° after the first sample. It should be noted that since every other sample is even, successive pairs of samples 90° apart are generated. The count is incremented at 117 so that the next time a sample is taken, 6.25 ms will be added to the timer at 115 to generate the delay between pairs of samples. When the count is 3 and 11, as determined at 103, the delay is 5.208 ms as indicated at 105. On count 7, the delay is 7.291 ms as indicated at 109. On count 15, 4.94 ms is added to the timer 101 and the count is set to zero at 119. Thus, it can be seen that the adjustments between pairs of samples is repeated after every sixteen samples. However, the sequence does not repeat at the same initial point until after four repetitions of the sixteen samples. Thus, the sixty-four samples are all evenly spaced apart over an equivalent cycle.

Figure 4:
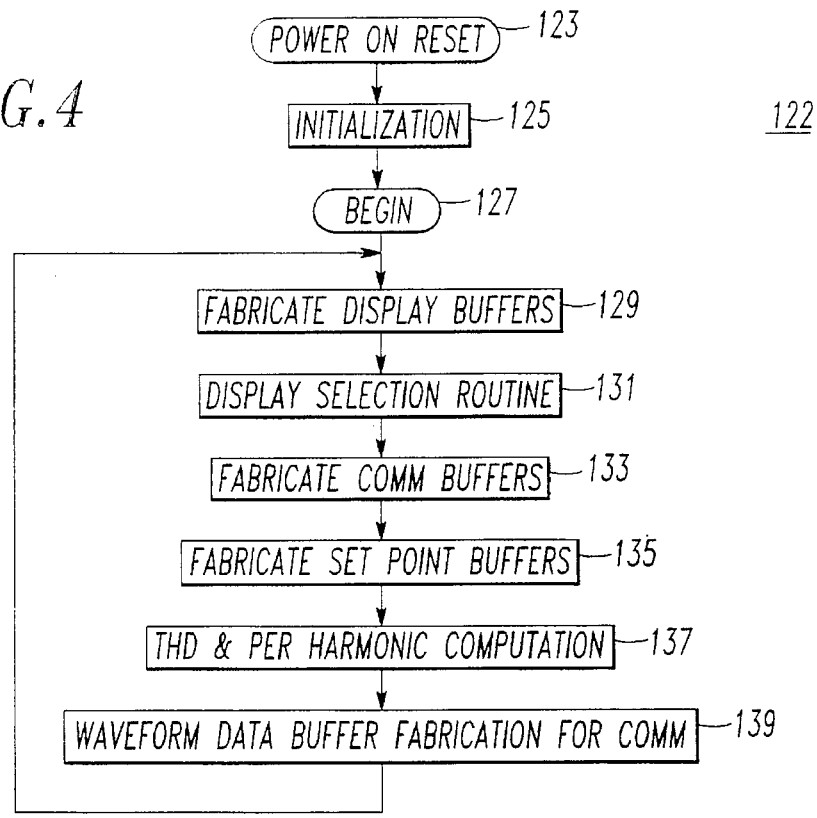
FIG. 4 is a flow chart of a main routine used by the digital processor.

FIG. 4 illustrates the pertinent features of the main routine 121 run by the digital processor 15. Following power on reset at 123, and initialization at 125, the routine enters a loop at 127 which is interrupted regularly as required by the interrupt routine 29. The main loop includes fabricating display buffers at 129 by assembling the values needed to generate a selected display on the display 21 on the front panel 19. As will be discussed in more detail below, this is a four digit alphanumeric display. A display selection routine is then run at 131 to scan the front panel input buttons to determine selections made for display by the user. Next, data to be transferred by the communications link 27 is loaded into buffers at 133. At 135 the various set points which determine the protection current/time characteristic implemented by the trip unit are read into buffers for use by the digital processor 15. These set points are checked on each run of the main routine to make sure that the latest setpoints input by the user locally or remotely are used for protection.

At 137 the high speed data collected in the waveform capture mode is used to compute harmonic distortion. This is implemented using Fourier analysis as is well known. Both total harmonic distortion (THD) and individual harmonic (per harmonic) distortion are computed. The raw waveform data, i.e., the sample values, gathered during waveform capture are placed in buffers at 139 for transmission to a remote computer (not shown) for storage and further analysis which may include graphic display.

Figure 2B:
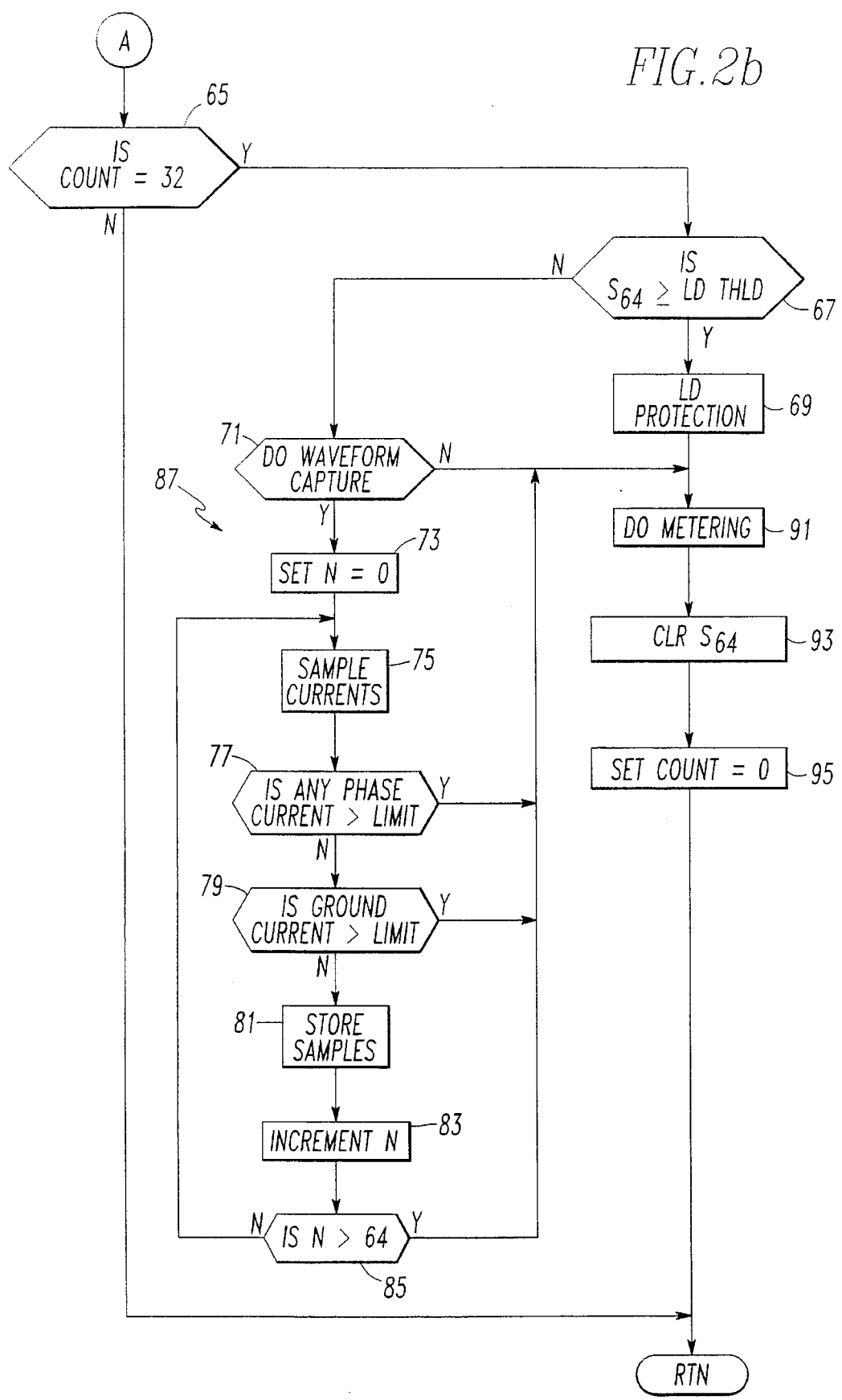

As an alternative to executing a request for waveform capture in the interrupt routine, as shown at 87, in FIG. 2b, the transfer to the waveform capture mode of operation can be implemented in the main routine shown in FIG. 4 such as after fabrication of the set point buffers at 135. The routine is similar to that illustrated at blocks 71 to 85 in FIG. 2b.

Figure 5:
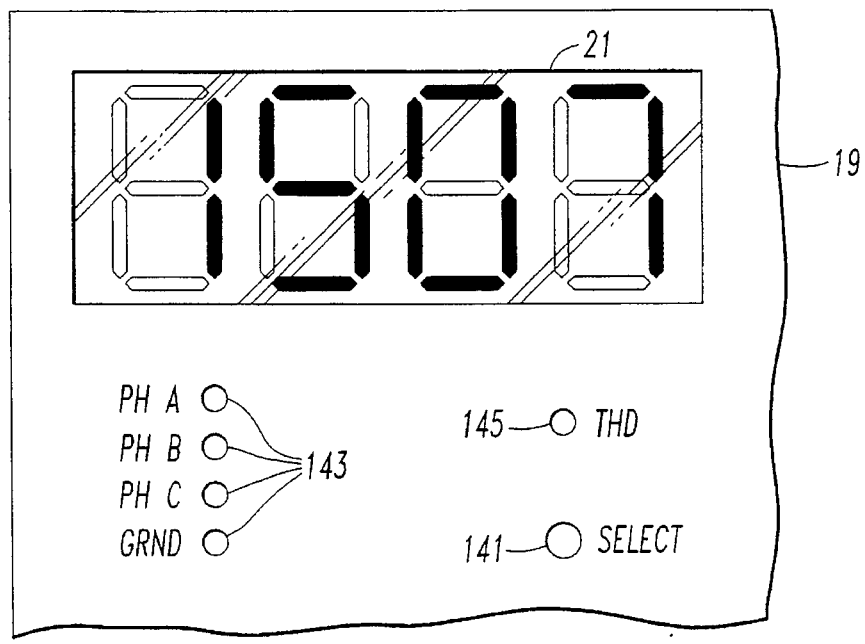
FIG. 5 is a fragmented front elevation view of the front panel of a circuit breaker in accordance with the invention.

FIG. 5 illustrates an example of the manner in which the harmonic distortion is presented on the display 21 on the front panel 19. The display 21 is a four digit, seven element per digit display. The per harmonic distortion values are displayed sequentially, with the two digits on the left presenting the number of the harmonic and the two on the right presenting the value of that individual harmonic as a percentage of the value of the fundamental. Thus, as shown, the value of the distortion of the 15th harmonic is 07% in the example of FIG. 5. The harmonic content is displayed by pressing a SELECT button 141 until a light emitting diode (LED) 143 for a selected current comes on together with a THD LED 145. The total harmonic distortion will then be presented as a two digit number. If the SELECT button 141 is continuously depressed, the display 21 will then present the per harmonic distortion by first display "1–99" ("99" is the highest number displayed) indicating the fundamental, followed sequentially at about one second intervals by the per cent distortion for each individual harmonic, in the manner discussed above and illustrated in FIG. 5 for the 15th harmonic. In the exemplary system, the per harmonic distortion is displayed for the 2nd through 27th harmonic. The display 21 can be used for presenting other information to the user, such as the set point values, RMS current and voltage, power and so forth.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. A circuit interrupter for interrupting current in an electrical system, said circuit interrupter comprising:

separable contacts interrupting said current when opened;

sensing means sensing waveforms in said electrical system including at least one current waveform;

sampling means sampling said waveforms sensed by said sensing means at sampling instants to generate digital samples of said waveforms including current samples of said at least one current waveform; and processing means having protection means operating in a protection mode to trip said separable contacts open in response to a selected current/time characteristic of said current waveform repetitively determined from said digital samples, and waveform capture means operating in a capture mode to store said digital samples of said waveform, wherein said processing means comprises sampling instant generating means generating sampling instants at a first sampling rate for said protection mode, and at a second sampling rate for said waveform capture means operating in said capture mode.

2. The circuit interrupter of claim 1 wherein said first sampling rate generated by said sampling instant generating means is an equivalent sampling rate, and wherein said second sampling rate generated by said sampling instant generating means is a synchronous sampling rate.

3. The circuit interrupter of claim 1 wherein said sampling instant generating means generating samples at said first sampling rate generates pairs of samples 90 electrical degrees apart, and in generating samples at said second sampling rates generates samples synchronously at a rate of more than four samples per cycle.

4. The circuit interrupter of claim 3 wherein said sampling instant generating means provides adjustable time delays between successive pairs of samples generated at said first sampling rate.

5. The circuit interrupter of claim 3 wherein said waveform capture means includes means monitoring current sample magnitude and transfers operation to said protection means when said magnitude of said current samples satisfies predetermined conditions.

6. A circuit interrupter for interrupting current in an electrical system, said circuit interrupter comprising:

separable contacts interrupting said current when opened;

sensing means sensing waveforms in said electrical system including a least one current waveform;

sampling means sampling said waveforms sensed by said sensing means at sampling instants to generate digital samples of said waveforms including current samples of said at least one current waveform; and processing means having protection means operating in a protection mode to trip said separable contacts open in response to a selected current/time characteristic of said current waveform repetitively determined from said digital samples, and waveform capture means operating in a capture mode to store said digital samples of said waveform, wherein said waveform capture means operating in said capture mode includes monitoring means monitoring digital samples of said current waveform generated by said sampling means and transferring operation to said protection means operating in said protection mode when said current samples satisfy predetermined conditions, wherein said processing means comprises sampling instant generating means generating sampling instants at a first sampling rate for said protection means operating in said protection mode, and at a second sampling rate for said waveform capture means operating in said capture mode.

7. The circuit interrupter of claim 6 wherein said sampling instant generating means generates said sampling instants at an equivalent sampling rate to produce said first sampling rate, and at a synchronous sampling rate to produce said second sampling rate.

8. The circuit interrupter of claim 7 wherein said sampling instant generating means generates sampling instants in pairs spaced 90 electrical degrees apart and with adjustable delays between successive pairs of samples to generate said equivalent sampling rate.

9. The circuit interrupter of claim 8 wherein said monitoring means transfers operation to said protection means operating in said protection mode when a magnitude of said current samples exceeds a predetermined threshold.

10. The circuit interrupter of claim 7 wherein said processing means includes means performing harmonic analysis on said digital samples generated in said waveform capture mode.

11. The circuit interrupter of claim 10 wherein said means performing harmonic analysis generates individual harmonic values for a plurality of harmonics and wherein said processing means includes display means displaying said individual harmonic values.

* * * * *